United States Patent
Zhang et al.

(10) Patent No.: US 12,418,084 B2
(45) Date of Patent: Sep. 16, 2025

(54) 3D FILTER AND FABRICATION METHOD THEREOF

(71) Applicant: QuantumZ Inc., Kaohsiung (TW)

(72) Inventors: Gang-Lin Zhang, Kaohsiung (TW); Meng-Hua Tsai, Tainan (TW); Weiting Lee, Kaohsiung (TW); Sin-Siang Wang, Kaohsiung (TW)

(73) Assignee: QuantumZ Inc., Kaohsiung (TW)

( * ) Notice: Subject to any disclaimer, the term of this patent is extended or adjusted under 35 U.S.C. 154(b) by 287 days.

(21) Appl. No.: 18/183,175

(22) Filed: Mar. 14, 2023

(65) Prior Publication Data

US 2023/0299450 A1    Sep. 21, 2023

(30) Foreign Application Priority Data

Mar. 15, 2022   (TW) .................................. 111109454

(51) Int. Cl.
| | |
|---|---|
| *H01P 1/203* | (2006.01) |
| *H01P 1/20* | (2006.01) |
| *H01P 7/08* | (2006.01) |
| *H05K 1/03* | (2006.01) |
| *H05K 1/11* | (2006.01) |

(52) U.S. Cl.
CPC ................ *H01P 1/20* (2013.01); *H01P 1/203* (2013.01); *H01P 1/20381* (2013.01); *H01P 7/08* (2013.01); *H05K 1/0353* (2013.01); *H05K 1/115* (2013.01); *H05K 2201/0141* (2013.01)

(58) Field of Classification Search
CPC .. H01P 1/20; H01P 1/201; H01P 1/203; H01P 1/20345; H01P 1/20354; H01P 1/20381; H01P 1/2135; H01P 7/08; H03H 7/09; H03H 7/12; H03H 7/17; H03H 7/01
See application file for complete search history.

(56) References Cited

U.S. PATENT DOCUMENTS

| | | | |
|---|---|---|---|
| 9,325,047 B1* | 4/2016 | Mumcu .................. | H01P 1/2135 |
| 2009/0189716 A1* | 7/2009 | Lu ........................ | H01P 1/20381 |
| | | | 333/204 |
| 2020/0076031 A1* | 3/2020 | Nam .................... | H01P 1/20381 |

* cited by examiner

*Primary Examiner* — Stephen E. Jones
(74) *Attorney, Agent, or Firm* — CKC & Partners Co., LLC (57) ABSTRACT

A three-dimensional (3D) filter and a fabrication method thereof are provided. The 3D filter includes a circuit board, a first ring resonator, a second ring resonator and a via structure. The circuit board includes a first circuit layer, a second circuit layer and a third circuit layer. The third circuit layer is located between the first circuit board and the second circuit board. The first ring resonator is disposed in the first circuit layer and has a first ring surrounded area corresponding to a first cut-off frequency band. The second ring resonator is disposed in the second circuit layer and has a second ring surrounded area corresponding to a second cut-off frequency band. The via structure passes through the first circuit layer, the second circuit layer and the third circuit layer, and is electrically connected to the first ring resonator and the second ring resonator.

15 Claims, 10 Drawing Sheets

3D FILTER AND FABRICATION METHOD THEREOF

RELATED APPLICATIONS

This application claims priority to Taiwan Application Serial Number 111109454 filed Mar. 15, 2022, which is herein incorporated by reference.

BACKGROUND

Technical Field

The invention relates to a three-dimensional (3D) filter and a fabrication method thereof.

Description of Related Art

Transmission frequency of wireless signals is getting higher and higher as along with the development of wireless communication technology. Therefore, filters corresponding to higher transmission frequencies are required to meet the wireless communication technology. Especially when the filters are designed to meet requirements of electrical characteristics in a limited product area. For example, existing antenna filter in package (AFIP) is required to design the antenna filter in a small plane area. In addition, most filters designed in the millimeter wave frequency bands cannot maintain a transmission loss less than −1 dB in the passband and flatness of the filters are not considered when the filters are designed. The linearity of the amplifier in a corresponding radio transmitting system is affected when the flatness of the filter is not managed.

Therefore, a filter can be easily disposed in a limited surface area with low loss and high flatness characteristics is needed.

SUMMARY

Embodiments of the invention provide a three-dimensional (3D) filter and a fabrication method thereof. The filter adopts a 3D stagger structure to achieve the purpose of having a smaller plane area and taking into account low loss and high flatness characteristics.

According to the present invention, the 3D filter includes a circuit board, a first ring resonator, a second ring resonator and a via structure. The circuit board includes a first circuit layer, a second circuit layer and a third circuit layer. The second circuit layer is located on the first circuit layer, and the third circuit layer is located between the first circuit layer and the second circuit layer. The first ring resonator is disposed in the first circuit layer of the circuit board, in which the first ring resonator has a first ring surrounded area and corresponds to a first cut-off frequency band. The second ring resonator is disposed in the second circuit layer of the circuit board, in which the second ring resonator has a second ring surrounded area and corresponds to a second cut-off frequency band. The via structure passes through the first circuit layer, the second circuit layer and the third circuit layer, and is electrically connected to the first ring resonator and the second ring resonator. The first ring surrounded area of the first ring resonator is different in size from the second ring surrounded area of the second ring resonator, and the first cut-off frequency band is different in frequency from the second cut-off frequency band. The first ring resonator corresponds to one of a higher cut-off frequency band and a lower cut-off frequency band, and the second ring resonator corresponds to the other one of the higher cut-off frequency band and the lower cut-off frequency band.

In some embodiments, the 3D filter further includes: a first signal feed-in line, a first signal output line, a second signal feed-in line and a second signal output line. The first signal feed-in line is disposed in the second circuit layer of the circuit board, and is electrically connected to the second ring resonator. The first signal output line is disposed in the second circuit layer of the circuit board, and is electrically connected between the second ring resonator and the via structure. The second signal feed-in line is disposed in the first circuit layer of the circuit board, and is electrically connected between the first ring resonator and the via structure. The second signal output line is disposed in the first circuit layer of the circuit board, and is electrically connected to the first ring resonator. Extension directions of the first signal feed-in line and the second signal feed-in line are perpendicular to each other, and extension directions of the first signal output line and the second signal output line are perpendicular to each other to form an orthogonal feed-in structure. The first signal feed-in line is used as one of an input port and an output port of the 3D filter, and the second signal output line is used as another one of the input port and the output port of the 3D filter.

In some embodiments, the 3D filter further includes: a first open stub, a second open stub, a third open stub and a fourth open stub. The first open stub is disposed in the first circuit layer of the circuit board and is electrically connected to the first ring resonator. The second open stub is disposed in the first circuit layer of the circuit board and is electrically connected to the first ring resonator. The third open stub is disposed in the second circuit layer of the circuit board and is electrically connected to the second ring resonator. The fourth open stub is disposed in the second circuit layer of the circuit board and is electrically connected to the second ring resonator.

In some embodiments, the first ring resonator has a first side, a second side, a third side and a fourth side. The first side is opposite to the third side, and the second side is opposite to the fourth side. The second signal output line is adjacent to the second side. The second signal feed-in line is adjacent to the first side. The first open stub is adjacent to the fourth side. The second open stub is adjacent to the third side.

In some embodiments, the second ring resonator has a fifth side, a sixth side, a seventh side and an eighth side. The fifth side is opposite to the seventh side, and the sixth side is opposite to the eighth side. The first signal feed-in line is adjacent to the eighth side. The first signal output line is adjacent to the fifth side. The third open stub is adjacent to the seventh side. The fourth open stub is adjacent to the sixth side.

In some embodiments, the first open stub, the second open stub, the third open stub and the fourth open stub are quarter-wavelength open stubs.

In some embodiments, the first signal feed-in line has a first end portion, a second end portion and a middle portion, the first end portion is adjacent to the second ring resonator, the second end portion is distal from the second ring resonator, the middle portion is located between the first end portion and the second end portion, and a width of the first signal output line gradually widens from the first end portion to the second end portion to provide a stepped impedance.

In some embodiments, the 3D filter further includes: a first metal patch and a second metal patch. The first metal patch is disposed in the first circuit layer of the circuit board and is located in the first ring surrounded area of the first ring resonator. The second metal patch is disposed in the second circuit layer of the circuit board and is located in the second ring surrounded area of the second ring resonator.

In some embodiments, the 3D filter further includes: an insulating material disposed around the opening to prevent the via structure from being electrically connected to the ground metal layer.

In some embodiments, the 3D filter further includes a ground metal layer. The ground metal layer is disposed in the third circuit layer as a common reference ground plane of the first ring resonator and the second ring resonator. The ground metal layer has an opening, and the via structure passes through the opening to vertically penetrate the ground metal layer.

In some embodiments, the circuit board further includes a first liquid crystal polymer (LCP) layer and a second liquid crystal polymer layer, wherein the first LCP layer is located between the first circuit layer and the second circuit layer, the second LCP layer is located between the second circuit layer and the third circuit layer, and the via structure further penetrates the first LCP layer and the second LCP layer.

According to an embodiment of the present invention, the fabrication method of the 3D filter includes: forming a first ring resonator in the first circuit layer according to a predetermined frequency band of the 3D filter, and forming a second ring resonator in the second circuit layer, in which the first ring resonator has a first ring surrounded area corresponding to a first cut-off frequency band of the predetermined frequency band, the second ring resonator has a second ring surrounded area corresponding to a second cut-off frequency band of the predetermined frequency band, and the first ring surrounded area is different in size from the second ring surrounded area; forming a ground metal layer in the third circuit layer, in which the third circuit layer is located between the first circuit layer and the second circuit layer, and the ground metal layer serves as a common reference ground plane for the first ring resonator and the second ring resonator; and forming a via structure in the first circuit layer, the second circuit layer and the third circuit layer, in which the via structure passes through the first circuit layer, the second circuit layer and the third circuit layer to electrically connected to the first ring resonator and the second ring resonator.

In some embodiments, the method for fabricating the 3D filter further includes: forming a first signal feed-in line, a first signal output line, a third open stub, a fourth open stub and a second metal patch in the second circuit layer according to the predetermined frequency band of the 3D filter.

In some embodiments, the method for fabricating the 3D filter further includes: forming a second signal feed-in line, a second signal output line, a first open stub, a second open stub and a first metal patch in the first circuit layer according to the predetermined frequency band of the 3D filter.

In some embodiments, the method for fabricating the 3D filter further includes: forming an opening in the ground metal layer, wherein the via structure passes through the opening to vertically penetrate the ground metal layer.

DETAILED DESCRIPTION

Terms "first", "second", etc. used herein do not specifically refer to particular order or sequence, but to distinguish elements or operations described with the same technical terms.

Figure 1:
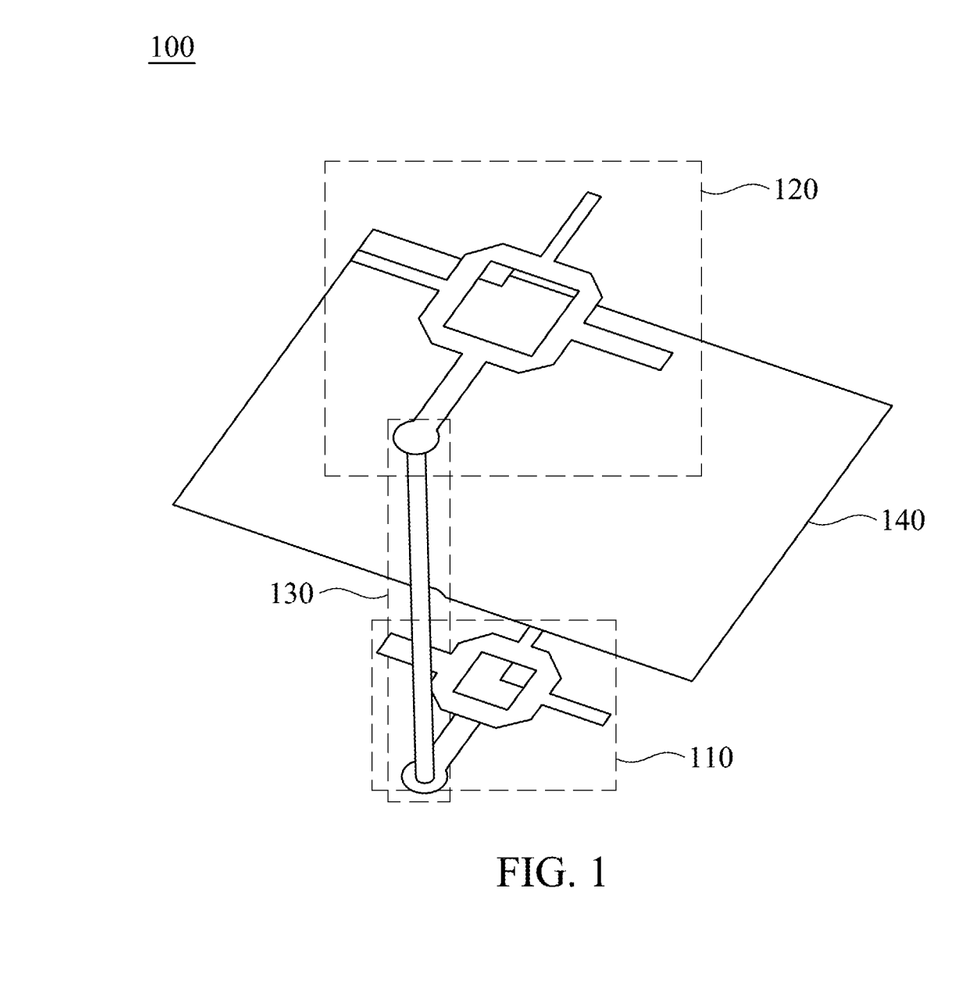
FIG. 1 is a schematic diagram showing the structure of a three-dimensional (3D) filter according to an embodiment of the present invention.

Referring to FIG. 1, a schematic structural diagram showing a three-dimensional (3D) filter 100 in accordance with an embodiment of the present invention. The 3D filter 100 includes a first ring filter 110, a second ring filter 120, and a via structure 130 electrically connecting the first ring filter 110 and the second ring filter 120, in which a ground metal layer 140 is disposed between the first ring filter 110 and the second ring filter 120. The first ring filter 110 and the second ring filter 120 are disposed on opposite sides of the ground metal layer 140, the via structure 130 penetrates the ground metal layer 140 to electrically connect the first ring filter 110 and the second ring filter 120, in which the via structure 130 is not electrically connected to the ground metal layer 140.

Figure 2:
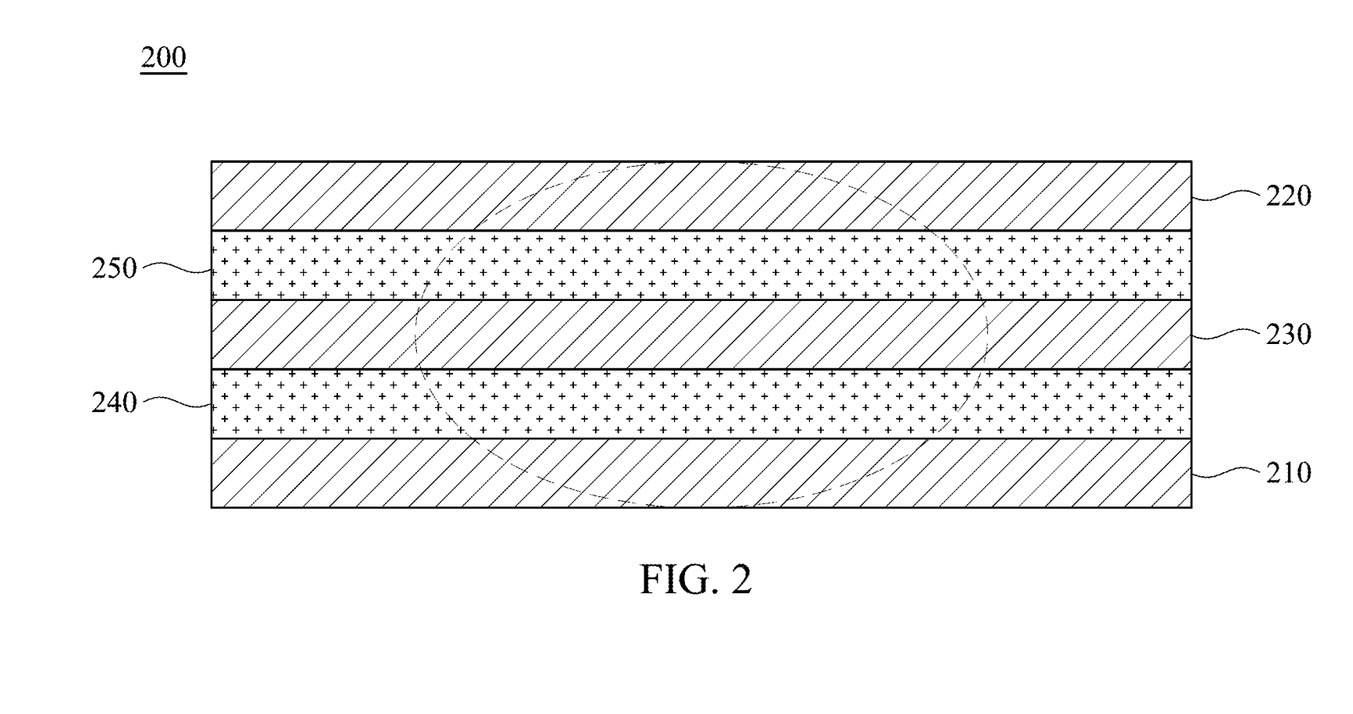
FIG. 2 is a schematic diagram showing the structure of circuit board of a 3D filter.

Referring to FIG. 2, a schematic structural diagram showing a circuit board 200 of the 3D filter 100 in accordance with an embodiment of the present invention. The circuit board 200 includes a first circuit layer 210, a second circuit layer 220, a third circuit layer 230, a first insulating layer 240 and a second insulating layer 250. The second circuit layer 220 and the third circuit layer 230 are located on the first circuit layer 210, and the third circuit layer 230 is located between the first circuit layer 210 and the second circuit layer 220. The first insulating layer 240 and the second insulating layer 250 are disposed on the first circuit layer 210, in which the first insulating layer 240 is disposed between the first circuit layer 210 and the third circuit layer 230 to provide electrical insulation between the first circuit layer 210 and the third circuit layer 230. The second insulating layer 250 is disposed between the third circuit layer 230 and the second circuit layer 220 to provide electrical insulation between the third circuit layer 230 and the second circuit layer 220.

In this embodiment, the first circuit layer 210, the second circuit layer 220 and the third circuit layer 230 are made of copper foil, and the first insulating layer 240 and the second insulating layer 250 are made of liquid crystal polymer (LCP) layers, but other embodiments of the present invention are not limited thereto. Other conductive materials and insulating materials may be used to form the first circuit layer 210, the second circuit layer 220, the third circuit layer 230, the first insulating layer 240 and the second insulating layer 250 according to actual demands. For example, the first circuit layer 210, the second circuit layer 220 and the third circuit layer 230 may be made of silver, gold, aluminum, nickel, iron or a compound of the above materials, and the first insulating layer 240 and the second insulating layer 250 may be made of polyimide (PI) or modified polyimide (MPI).

Referring to FIG. 1 and FIG. 2, the first ring filter 110 is located in the first circuit layer 210; the second ring filter 120 is located in the second circuit layer 220; the ground metal layer 140 is located in the third circuit layer 230; the via structure 130 passes through the first circuit layer 210, the second circuit layer 220 and the third circuit layer 230 in this embodiment. The via structure 130 may be made by using vias or blind holes in some embodiments.

Figure 3:
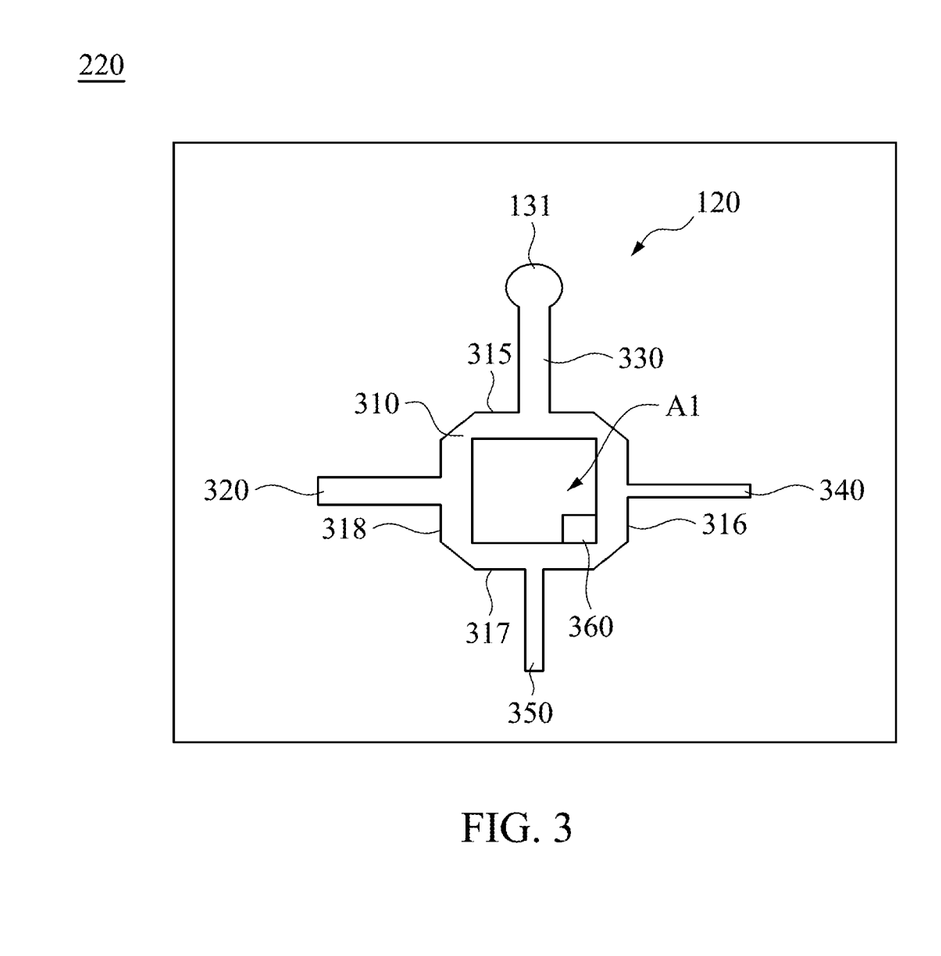
FIG. 3 is a schematic diagram showing the structure of a second ring filter according to an embodiment of the present invention.

Referring to FIG. 3, a schematic structural diagram showing the second ring filter 120 according to an embodiment of the invention, in which the second ring filter 120 is located in the second circuit layer 220. The second ring filter 120 includes a ring resonator 310, a first signal feed-in line 320 and a first signal output line 330. The ring resonator 310 has a ring surrounded area A1 with sides electrically connected to the first signal feed-in line 320 and the first signal output line 330. The first signal feed-in line 320 is used as an input port of the 3D filter 100 to receive a high-frequency input signal to be processed. The first signal output line 330 is electrically connected between the ring resonator 310 and an end portion 131 of the via structure 130 to provide an output signal to the via structure 130.

Figure 4:
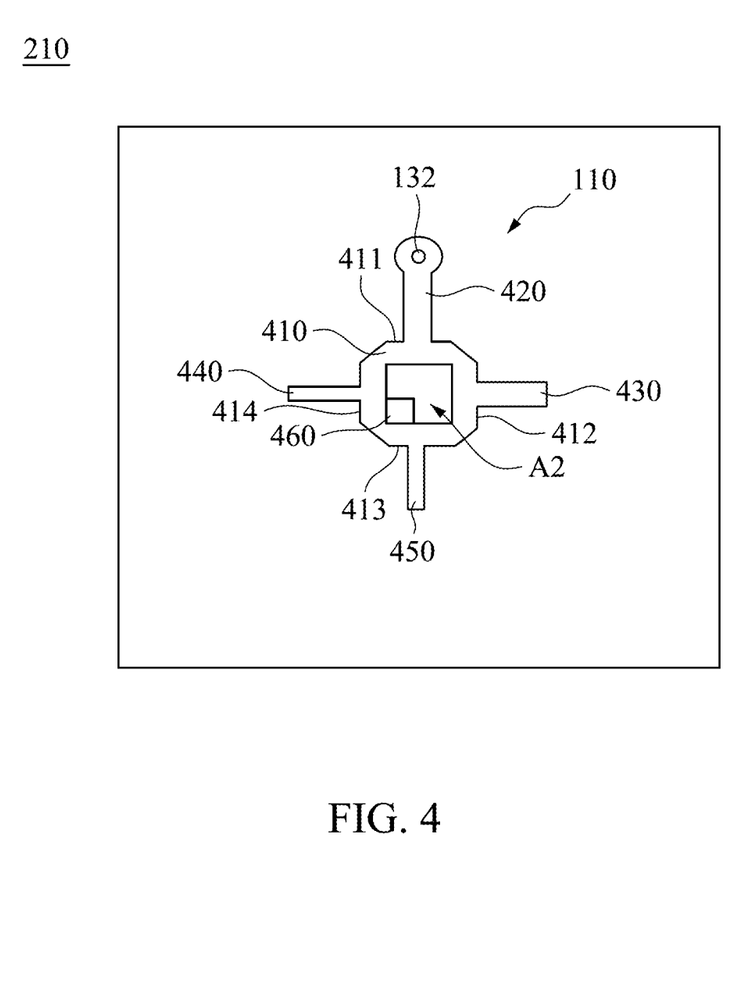
FIG. 4 is a schematic diagram showing the structure of a first ring filter according to an embodiment of the present invention.

Referring to FIG. 4, a schematic structural diagram showing the first ring filter 110 according to an embodiment of the invention, in which the first ring filter 110 is located in the first circuit layer 210. The first ring filter 110 includes a ring resonator 410, a second signal feed-in line 420 and a second signal output line 430. The ring resonator 410 has a ring surrounded area A2, and in this embodiment, the ring surrounded area A2 is smaller than the ring surrounded area A1. In other words, the first ring filter 110 is a small ring filter and the second ring filter 120 is a large ring filter. The second signal feed-in line 420 is electrically connected between the ring resonator 410 and the other end portion 132 of the via structure 130, and receives the output signal provided by the second ring filter 120 through the via structure 130. The second signal output line 430 is electrically connected to the ring resonator 410 to serve as an output port of the 3D filter 100. Therefore, the first ring filter 110 can output a high-frequency filter signal from the second signal output line 430 corresponding to the output signal provided by the second ring filter 120. However, the invention is not limited thereto. The first ring filter 110 may be designed to be larger than the second ring filter 120, and the sizes of the ring areas of the two filters must be different.

In addition, the 3D filter 100 provides an orthogonal feed-in structure. Specifically, extension directions of the first signal feed-in line 320 and the second signal feed-in line 420 are perpendicular to each other, and extension directions of the first signal output line 330 and the second signal output line 430 are perpendicular to each other to form the orthogonal feed-in structure. In this embodiment, the first signal feed-in line 320 is an input port of the 3D filter, and the second signal output line 430 is an output port of the 3D filter. In other embodiments, the configurations of the input port and the output port can also be reversed, so that the first signal feed-in line 320 becomes the output port, and the second signal output line 430 becomes the input port. In other words, a signal to be filtered can be input from the first signal feed-in line 320, and then the filtered signal can be output through the second signal output line 430. Alternatively, the signal to be filtered can be input from the second signal output line 430, and then the filtered signal can be output through the first signal feed-in line 320.

In this embodiment, the first ring filter 110 further includes a first open stub 440, a second open stub 450 and a first metal patch 460. The first open stub 440 is disposed on one side of the ring resonator 410 and is opposite to one of the second signal feed-in line 420 and the second signal output line 430, and the second open stub 450 is disposed on the other side of the ring resonator 410 and is opposite to the other one of the second signal feed-in line 420 and the second signal output line 430. Specifically, the ring resonator 410 has a first side 411, a second side 412, a third side 413 and a fourth side 414, in which the first side 411 is opposite to the third side 413, and the second side 412 is opposite to the fourth side 414. The second signal output line 430 is adjacent to the second side 412, and the first open stub 440 is adjacent to the fourth side 414. The second signal feed-in line 420 is adjacent to the first side 411, and the second open stub 450 is adjacent to the third side 413. The first metal patch 460 is disposed in the ring surrounded area A2 and is disposed corresponding to the first open stub 440 and the second open stub 450. Specifically, the first open stub 440 and the second open stub 450 are adjacent to the fourth side 414 and the third side 413, and the first metal patch 460 is disposed in a corner corresponding to the third side 413 and the fourth side 414. According to the above design, the first open stub 440 and the second open stub 450 can be combined with the ring resonator 410 to provide a bandpass filter, and the first metal patch 460 can provide impedance matching for the impedance discontinuity problem caused by the via structure 130. A bandwidth of the first ring filter 110 may be affected by the size of the first metal patch 460. The larger the size of the first metal patch 460 is, the larger the bandwidth of the first ring filter 110 is.

Similarly, retuning to FIG. 3, the second ring filter 120 further includes a third open stub 350, a fourth open stub 340 and a second metal patch 360. The third open stub 350 is disposed on one side of the ring resonator 310 and is opposite to one of the first signal feed-in line 320 and the first signal output line 330, and the fourth open stub 340 is disposed on the other side of the ring resonator 310 and is opposite to the other of the first signal feed-in line 320 and the first signal output line 330. Specifically, the ring resonator 310 has a fifth side 315, a sixth side 316, a seventh side 317 and an eighth side 318, in which the fifth side 315 is opposite to the seventh side 317, and the sixth side 316 is opposite to the eighth side 318. The first signal feed-in line 320 is adjacent to the eighth side 318, and the third open stub 350 is adjacent to the seventh side 317. The first signal output line 330 is adjacent to the fifth side 315, and the fourth open stub 340 is adjacent to the sixth side 316. The second metal patch 360 is disposed in the ring surrounded area A1 and is disposed corresponding to the third open stub 350 and the fourth open stub 340. Specifically, the third open stub 350 and the fourth open stub 340 are adjacent to the sixth side 316 and the seventh side 317, and the second metal patch 360 is disposed in a corner corresponding to the sixth side 316 and the seventh side 317. According to the above design, the third open stub 350 and the fourth open stub 340 can be combined with the ring resonator 310 to provide a bandpass filter, and the second metal patch 360 can provide impedance matching for the impedance discontinuity problem caused by the via structure 130. A bandwidth of the second ring filter 120 can be affected by the size of the second metal patch 360. The larger the size of the second metal patch 360 is, the larger the bandwidth of the second ring filter 120 is.

In an embodiment of the invention, the wrapping length (or inner ring length) of the ring resonators 310 and 410 is n times a wavelength, where n is an integer greater than or equal to 1. The lengths of the first open stub 440, the second open stub 450, the third open stub 350 and the fourth open stub 340 are quarter-wavelengths. In addition, the ring resonators 310 and 410 are octagonal in the embodiment, but the embodiments of the invention are not limited thereto. In other embodiments of the present invention, the ring resonators 310 and 410 have shapes of up-down symmetry and bilateral symmetry, such as rectangular or hexagonal.

From the above description, it may be understood that the 3D filter 100 in embodiments of the present invention utilize the superposition of two passbands provided by the large ring filter (i.e. the second ring filter 120) and the small ring filter (i.e. the first ring filter 110) to provide a composite passband, in which a higher cut-off frequency of the composite passband of the 3D filter 100 is determined by the higher frequency passband provided by the second ring filter 120, and a lower cut-off frequency of the composite passband is determined by the lower frequency passband provided by the first ring filter 110. In this embodiment, the higher cut-off frequency of the composite passband is 64 GHZ, and the lower cut-off frequency of the composite passband is 54 GHZ, so an operating frequency is 60 GHz. However, embodiments of the present invention are not limited thereto. The first ring filter 110 and second ring filter 120 may be adjusted, so that the composite passband of the 3D filter 100 may meet different demands. For example, in embodiments of the present invention, the large ring filter (i.e. the second ring filter 120) may correspond to one of the higher cut-off frequency and the lower cut-off frequency (such as the higher cut-off frequency), and the small ring filter (i.e. the first ring filter 110) may correspond to the other one of the higher cut-off frequency and the lower cut-off frequency (such as the lower cut-off frequency). In some embodiments, the operating frequency of the 3D filter 100 may be 56.13-62.61 GHz.

Furthermore, the first ring filter 110 and the second ring filter 120 are made into a 3D connection structure in the 3D filter 100 of the embodiment of the present invention, in which the first ring filter 110 and the second ring filter 120 are electrically connected by the via structure 130 penetrating through the ground metal layer 140. Since the first ring filter 110 and the second ring filter 120 adopt the 3D connection structure, the 3D filter 100 has a smaller plane area.

Figure 5:
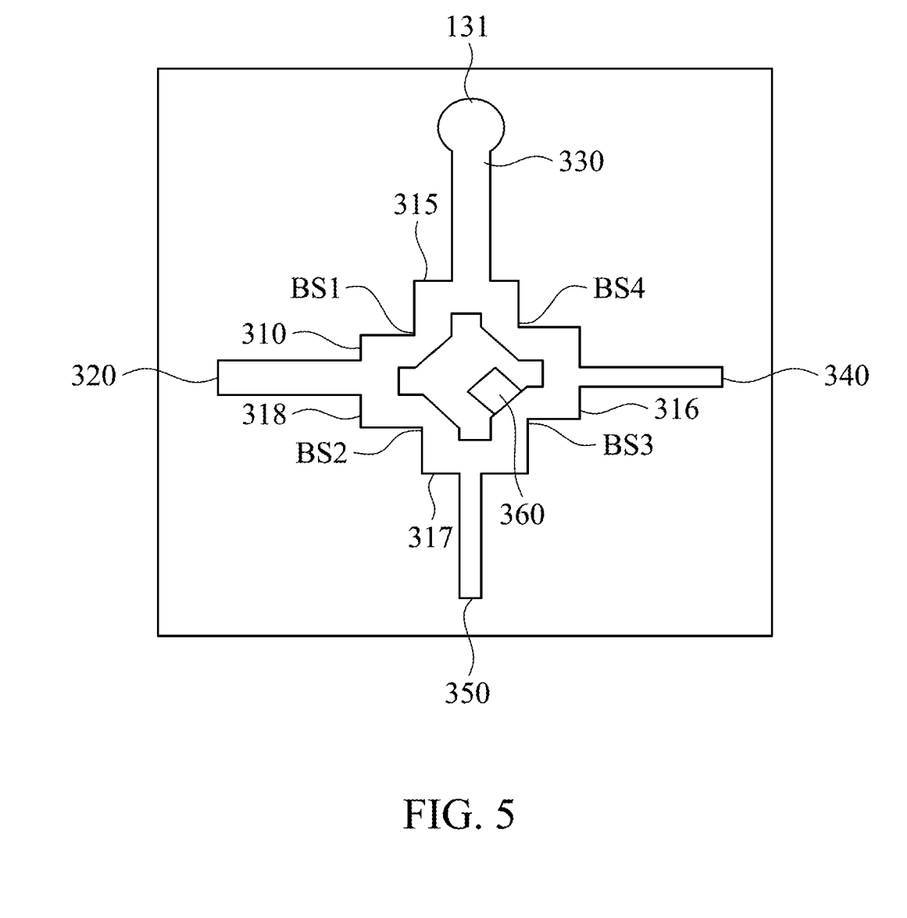
FIG. 5 is a schematic diagram showing the structure of a second ring filter according to another embodiment of the present invention.

Referring to FIG. 5, a schematic structural diagram showing a second ring filter 120 according to another embodiment of the present invention. In this embodiment, the shape of the ring resonator 310 of the second ring filter 120 is changed, and it further has a plurality of curved sides BS1-BS4, in which the curved side BS1 is located between the fifth side 315 and the eighth side 318; the curved side BS2 is located between the seventh side 317 and the eighth side 318; the curved side BS3 is located between the sixth side 316 and the seventh side 317; the curved side BS4 is located between the fifth side 315 and the sixth side 316. Through such a design, the length of the ring resonator 310 can be increased in a limited plane area, thereby changing the size and passband range provided by the 3D filter 100.

Similarly, the length of the ring resonator 410 of the first ring filter 110 can also be changed through the settings of curved sides. Since the details of the setting have been described in the above paragraphs, they will not be repeated here.

Figure 6:
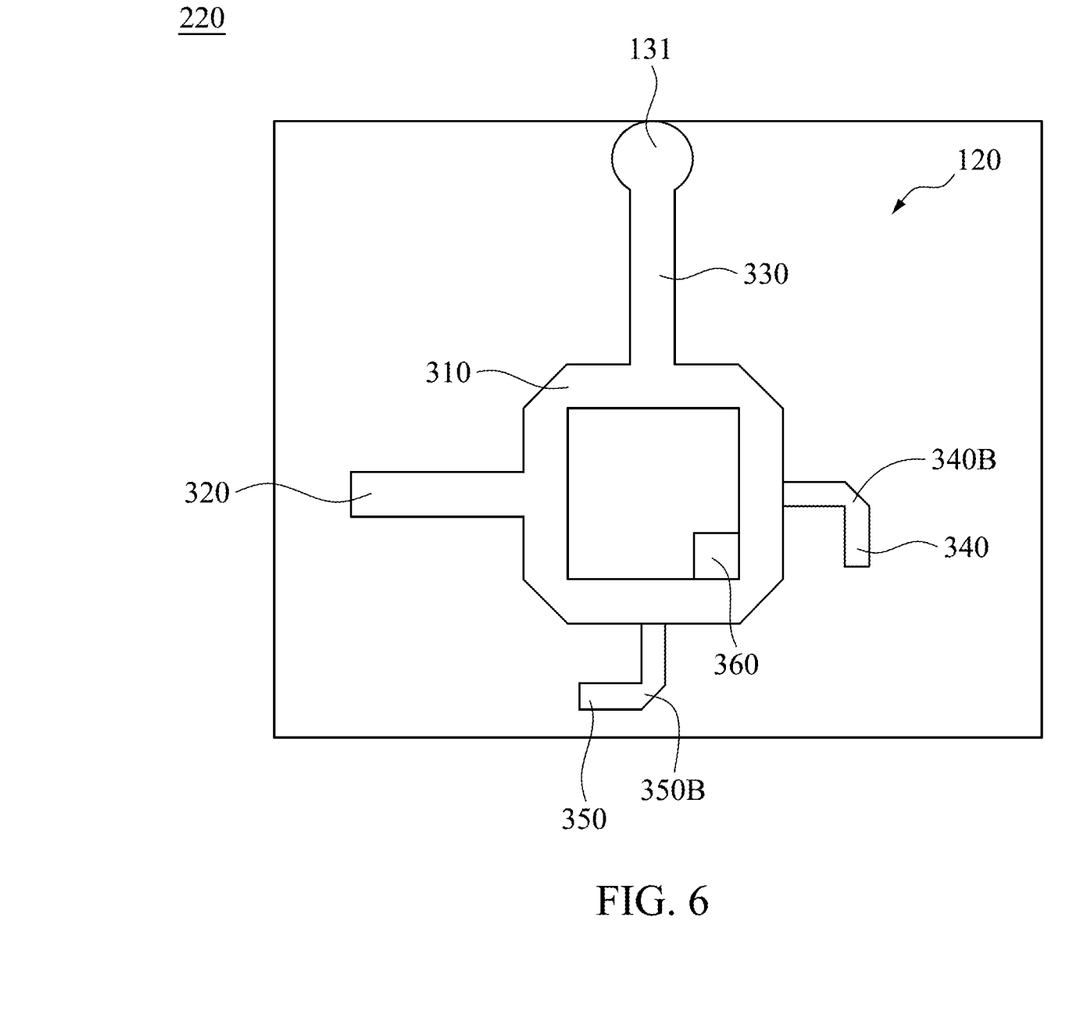
FIG. 6 is a schematic diagram showing the structure of a second ring filter according to another embodiment of the present invention.

Referring to FIG. 6, a schematic structural diagram showing a second ring filter 120 according to another embodiment of the present invention. In this embodiment, the shapes of the third open stub 350 and the fourth open stub 340 of the second ring filter 120 are modified to further have bent portions 340B and 350B. Through such a design, the lengths of the third open stub 350 and the fourth open stub 340 can be increased in a limited plane area, thereby changing the size and passband range provided by the 3D filter 100. Similarly, the lengths of the first open stub 440 and the second open stub 450 of the first ring filter 110 can also be changed through the settings of the bent portions.

Figure 7:
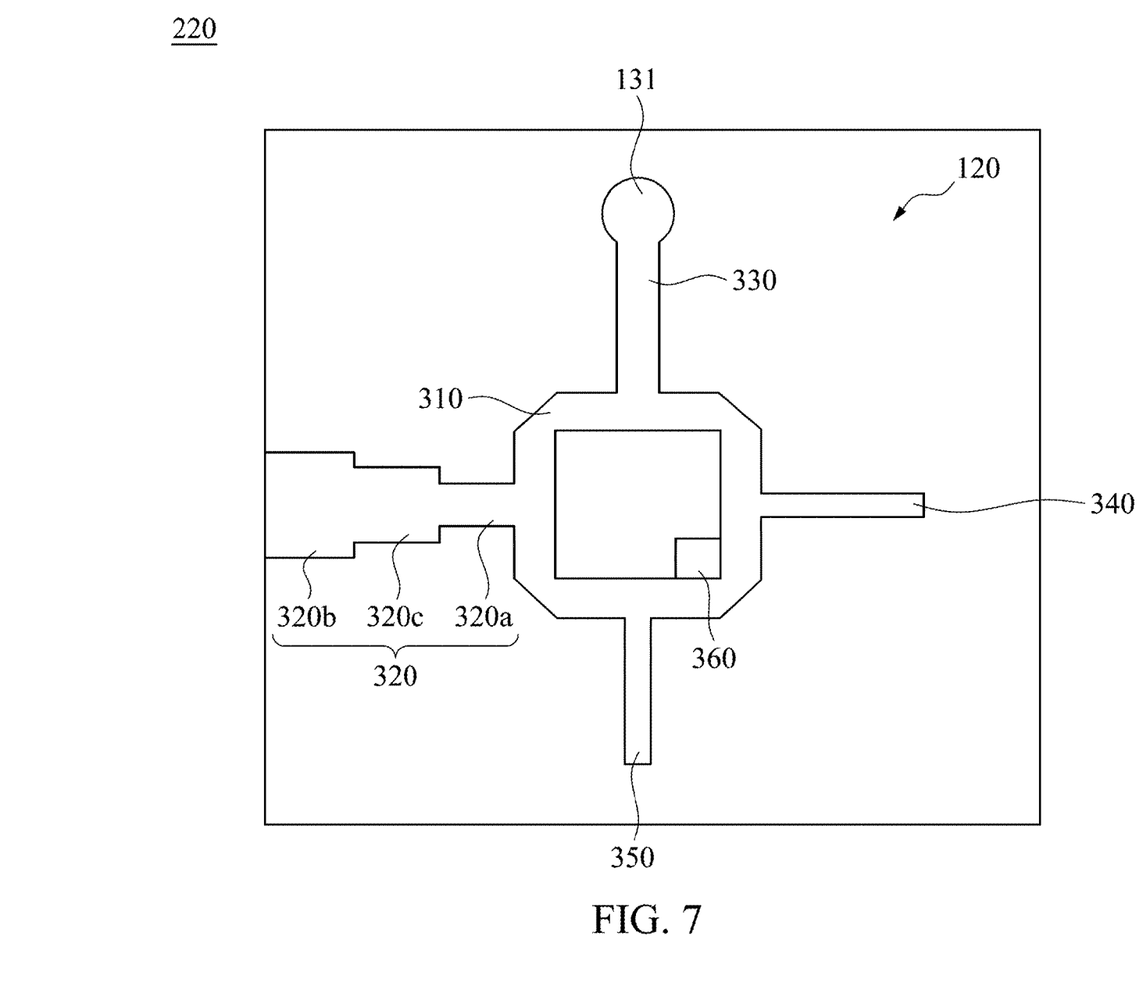
FIG. 7 is a schematic diagram showing the structure of a second ring filter according to another embodiment of the present invention.

Referring to FIG. 7, is a schematic structural diagram showing a second ring filter 120 according to another embodiment of the present invention. In this embodiment, the shape of the first signal feed-in line 320 of the second ring filter 120 is changed so that it has a stepped width change. Specifically, the first signal feed-in line 320 includes a first end portion 320*a*, a second end portion 320*b* and a middle portion 320*c*. The first end portion 320*a* is adjacent to the ring resonator 310, the second end portion 320*b* is distal from the ring resonator 310, the middle portion 320*c* is located between the first end portion 320*a* and the second end portion 320*b*, and the width of the first signal feed-in line 320 gradually widens from the first end portion 320*a* to the second end portion 320*b* to provide a stepped impedance.

Figure 8:
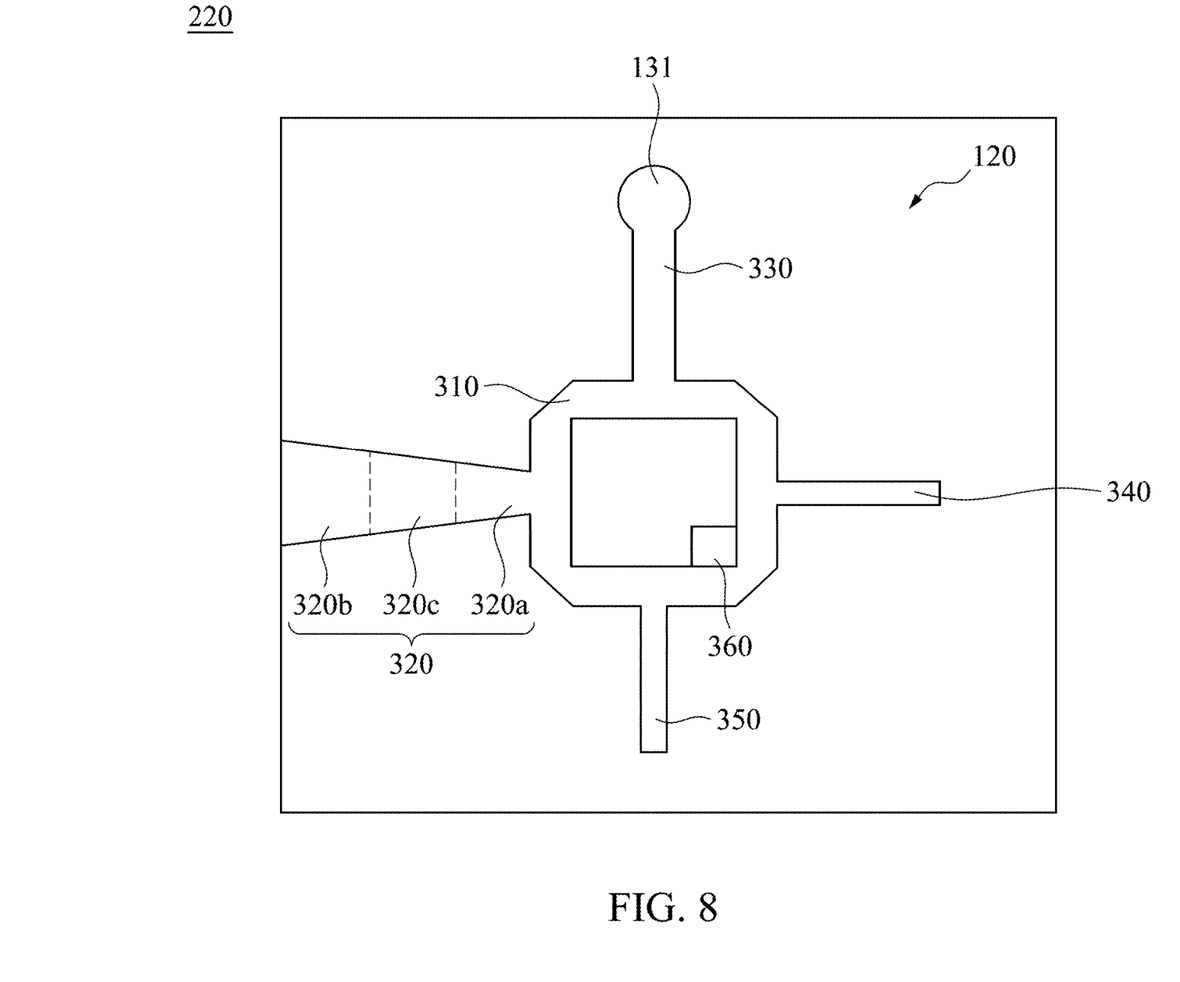
FIG. 8 is a schematic diagram showing the structure of a second ring filter according to another embodiment of the present invention.

Referring to FIG. 8, a schematic structural diagram showing a second ring filter 120 according to another embodiment of the present invention. In this embodiment, the shape of the first signal feed-in line 320 of the second ring filter 120 is changed so that it has a gradual width change. Specifically, the widths of the first end portion 320*a*, the second end portion 320*b*, and the middle portion 320*c* of the first signal feed-in line 320 change gradually, instead of the stepped change as shown in FIG. 7.

Figure 9:
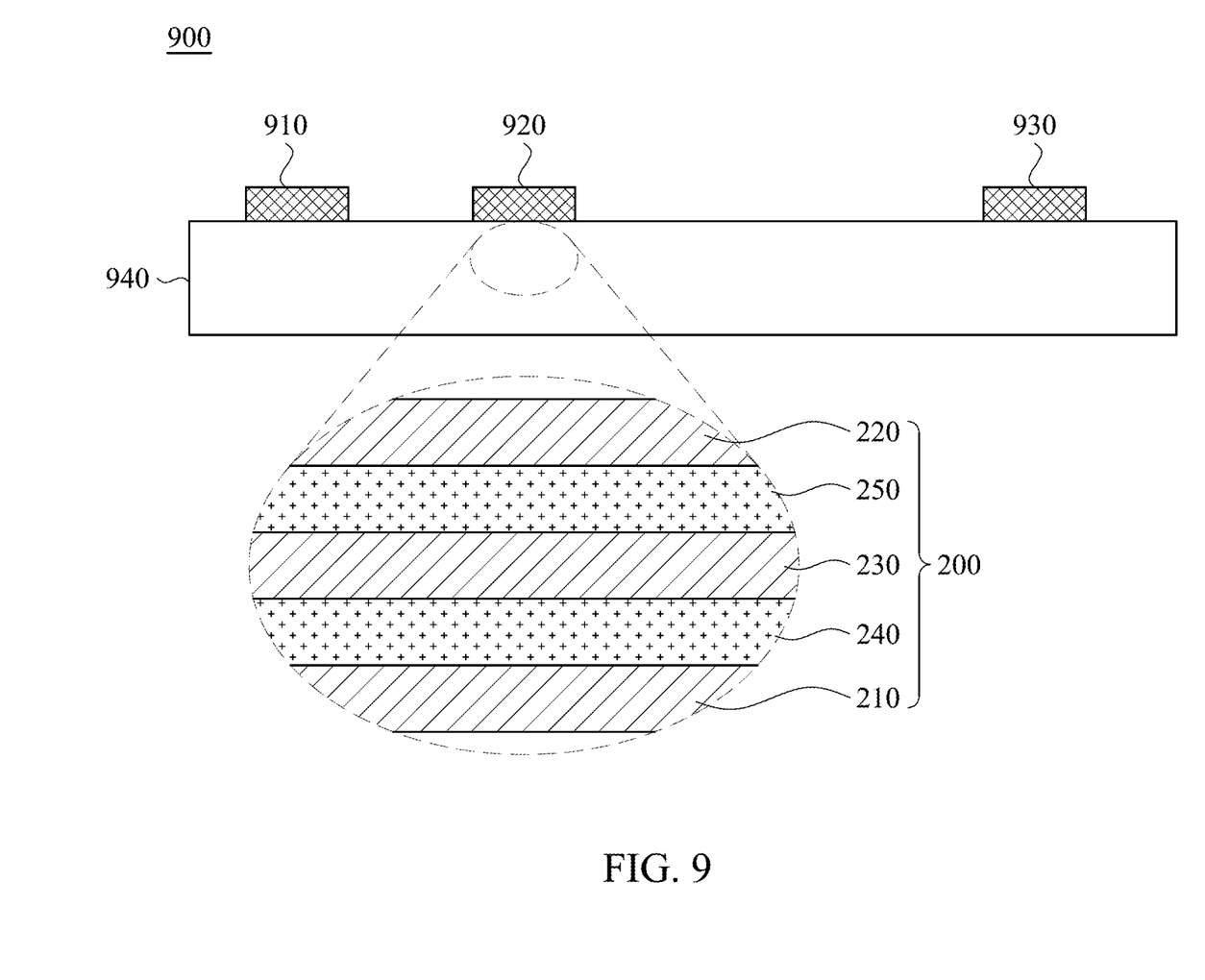
FIG. 9 is a schematic diagram showing the structure of an antenna module according to an embodiment of the present invention.

Referring to FIG. 9, a schematic structural diagram showing an antenna module 900 according to an embodiment of the present invention. The antenna module 900 includes a radio frequency chip (RF IC) 910, an antenna device 920, an antenna device 930 and a circuit board 940. The radio frequency chip 910, the antenna device 920 and the antenna device 930 are disposed on the circuit board 940, in which the circuit board 940 may have a multi-layer circuit structure to form various circuits. For example, the structure of the circuit board 200 is included to provide the 3D filter 100 (Referring to FIG. 1 and FIG. 2 together). In the embodiment, the antenna module 900 can be an antenna filter in package (AFIP). Compared with the conventional system in package (SiP), the antenna package of this embodiment is further integrated with the antenna device and the filter and has a smaller volume. In some embodiments, the circuits of the circuit board 200 may be used to form the antenna device, so that the antenna device 920 and the antenna device 930 can be omitted, and the space occupied by the antenna module 900 may be further reduced.

Figure 10:
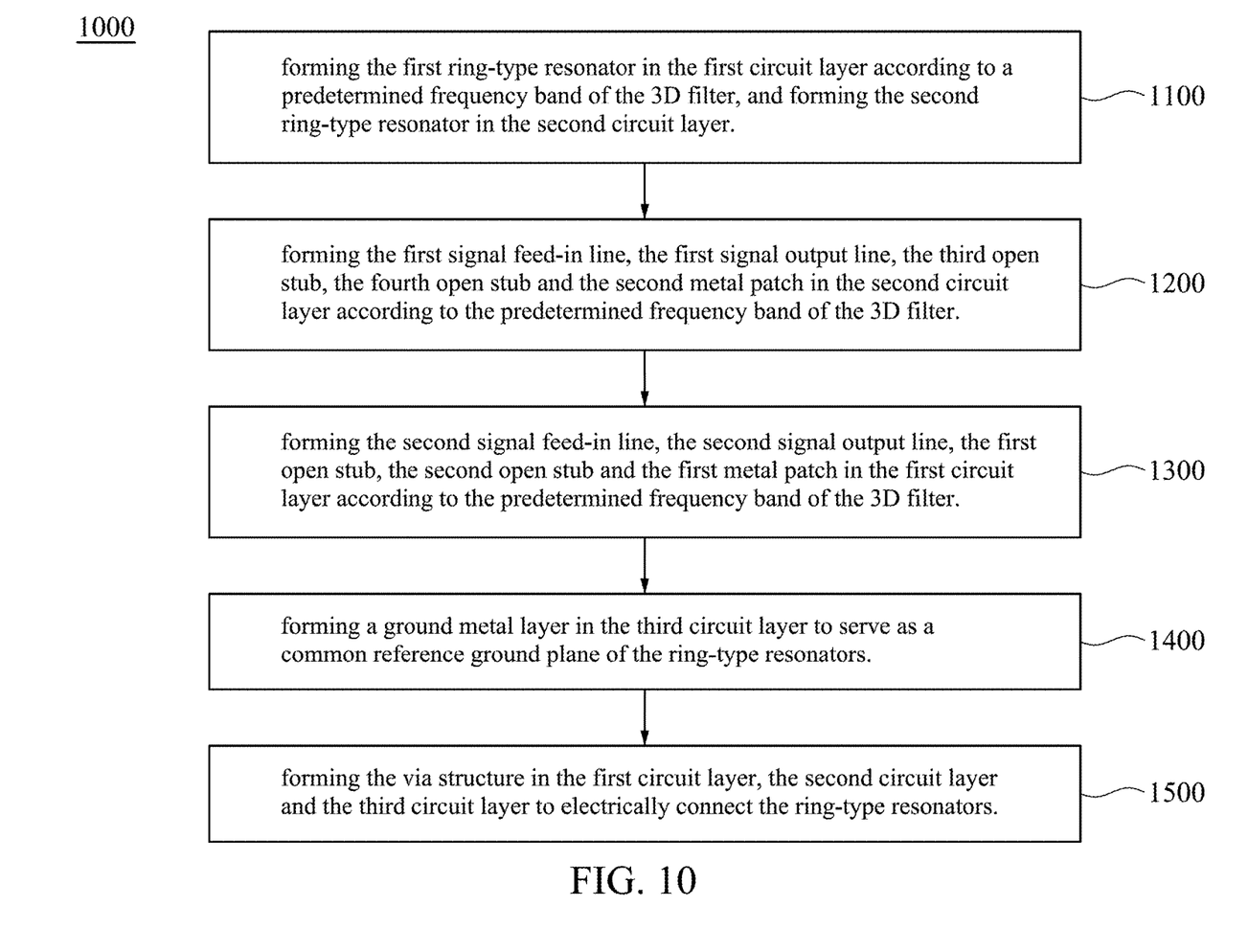
FIG. 10 is a schematic flowchart showing a method for manufacturing a 3D filter according to an embodiment of the present invention.

Referring to FIG. 10, a schematic flowchart showing a fabrication method 1000 of the 3D filter 100 according to an embodiment of the present invention. The fabrication method 1000 of the 3D filter 100 can be performed using, for example, automatic antenna production equipment. The antenna automatic production equipment may include a memory and a processor, in which the memory stores instructions, and the processor can load the instructions to perform the fabrication method 1000.

In the fabrication method 1000, step 1100 is first performed to form the ring resonator 410 in the first circuit layer 210 and to form the ring resonator 310 in the second circuit layer 220 according to a predetermined frequency band required by the 3D filter 100, in which the ring resonator 410 has a ring surrounded area A2 corresponding to the first cut-off frequency band of the predetermined frequency band (corresponding to the lower cut-off frequency), the ring resonator 310 has a ring surrounded area A1 corresponding to the second cut-off frequency band of the predetermined frequency band (corresponding to a higher cut-off frequency), and the ring surrounded area A2 is smaller than the ring surrounded area A1.

Then, step 1200 is performed to form the first signal feed-in line 320, the first signal output line 330, the third open stub 350, the fourth open stub 340 and the second metal patch 360 in the second circuit layer 220 according to the predetermined frequency band of the 3D filter 100.

Then, step 1300 is performed to form the second signal feed-in line 420, the second signal output line 430, the first open stub 440, the second open stub 450 and the first metal patch 460 in the first circuit layer 210 according to the predetermined frequency band of the 3D filter 100.

Then, step 1400 is performed to form a ground metal layer 140 in the third circuit layer 230 to serve as a common reference ground plane of the ring resonators 310 and 410.

Next, step 1500 is performed to form the via structure 130 in the first circuit layer 210, the second circuit layer 220 and the third circuit layer 230, in which the via structure 130 passes through the first circuit layer 210, the second circuit layer 220 and the third circuit layer 230 to electrically connect the ring resonators 310 and 410.

In some embodiments, the fabrication method 1000 forms an opening in the ground metal layer 140 so that the via structure 130 passes through the opening to electrically connect the ring resonators 310 and 410. In addition, an insulating material is disposed around the opening to prevent the via structure 130 from being electrically connected to the ground metal layer 140.

Although the present invention has been disclosed above with embodiments, it is not intended to limit the present invention. Those skilled in the art may make some changes and modifications without departing from the spirit and scope of the present invention. Therefore, the scope of protection of the present invention should be defined by the scope of the appended patent application.

What is claimed is:

1. A three-dimensional (3D) filter, comprising:
a circuit board comprising a first circuit layer, a second circuit layer and a third circuit layer, wherein the second circuit layer is located on the first circuit layer, and the third circuit layer is located between the first circuit layer and the second circuit layer;
a first ring resonator disposed in the first circuit layer of the circuit board, wherein the first ring resonator has a first ring surrounded area corresponding to a first cut-off frequency band;
a second ring resonator disposed in the second circuit layer of the circuit board, wherein the second ring resonator has a second ring surrounded area corresponding to a second cut-off frequency band; and
a via structure passing through the first circuit layer, the second circuit layer and the third circuit layer, and electrically connected to the first ring resonator and the second ring resonator;
wherein the first ring surrounded area of the first ring resonator is different in size from the second ring surrounded area of the second ring resonator, and the first cut-off frequency band is different in frequency from the second cut-off frequency band; the first ring resonator corresponds to one of a higher cut-off frequency band and a lower cut-off frequency band, and the second ring resonator corresponds to the other one of the higher cut-off frequency band and the lower cut-off frequency band.

2. The 3D filter of claim 1, further comprising:
a first signal feed-in line disposed in the second circuit layer of the circuit board, and electrically connected to the second ring resonator;
a first signal output line disposed in the second circuit layer of the circuit board, and electrically connected between the second ring resonator and the via structure;
a second signal feed-in line disposed in the first circuit layer of the circuit board, and electrically connected between the first ring resonator and the via structure; and
a second signal output line disposed in the first circuit layer of the circuit board, and electrically connected to the first ring resonator;
wherein extension directions of the first signal feed-in line and the second signal feed-in line are perpendicular to each other, and extension directions of the first signal output line and the second signal output line are perpendicular to each other to form an orthogonal feed-in structure;
wherein the first signal feed-in line is used as one of an input port and an output port of the 3D filter, and the second signal output line is used as another one of the input port and the output port of the 3D filter.

3. The 3D filter of claim 2, further comprising:
a first open stub disposed in the first circuit layer of the circuit board and electrically connected to the first ring resonator;
a second open stub disposed in the first circuit layer of the circuit board and electrically connected to the first ring resonator;
a third open stub disposed in the second circuit layer of the circuit board and electrically connected to the second ring resonator; and
a fourth open stub disposed in the second circuit layer of the circuit board and electrically connected to the second ring resonator.

4. The 3D filter of claim 3, wherein:
the first ring resonator has a first side, a second side, a third side and a fourth side, the first side is opposite to the third side, and the second side is opposite to the fourth side;
the second signal output line is adjacent to the second side;
the second signal feed-in line is adjacent to the first side;
the first open stub is adjacent to the fourth side; and
the second open stub is adjacent to the third side.

5. The 3D filter of claim 3, wherein:
the second ring resonator has a fifth side, a sixth side, a seventh side and an eighth side, the fifth side is opposite to the seventh side, and the sixth side is opposite to the eighth side;
the first signal output line is adjacent to the fifth side;

the first signal feed-in line is adjacent to the eighth side;
the third open stub is adjacent to the seventh side; and
the fourth open stub is adjacent to the sixth side.

6. The 3D filter of claim 3, wherein the first open stub, the second open stub, the third open stub and the fourth open stub are quarter-wavelength open stubs.

7. The 3D filter of claim 2, wherein the first signal feed-in line has a first end portion, a second end portion and a middle portion, the first end portion is adjacent to the second ring resonator, the second end portion is distal from the second ring resonator, the middle portion is located between the first end portion and the second end portion, and a width of the first signal output line gradually widens from the first end portion to the second end portion to provide a stepped impedance.

8. The 3D filter of claim 1, further comprising:
a first metal patch disposed in the first circuit layer of the circuit board and located in the first ring surrounded area of the first ring resonator; and
a second metal patch disposed in the second circuit layer of the circuit board and located in the second ring surrounded area of the second ring resonator.

9. The 3D filter of claim 1, further comprising:
a ground metal layer disposed in the third circuit layer as a common reference ground plane of the first ring resonator and the second ring resonator;
wherein the ground metal layer comprising an opening, and the via structure passes through the opening to vertically penetrate the ground metal layer.

10. The 3D filter of claim 9, further comprising:
an insulating material disposed around the opening to prevent the via structure from being electrically connected to the ground metal layer.

11. The 3D filter of claim 1, wherein the circuit board further comprises a first liquid crystal polymer (LCP) layer and a second liquid crystal polymer layer, the first liquid crystal polymer layer is located between the first circuit layer and the second circuit layer, the second liquid crystal polymer layer is located between the second circuit layer and the third circuit layer, and the via structure further penetrates the first liquid crystal polymer layer and the second liquid crystal polymer layer.

12. A method for fabricating a 3D filter, comprising:
forming a first ring resonator in a first circuit layer according to a predetermined frequency band of the 3D filter, and forming a second ring resonator in a second circuit layer, wherein the first ring resonator has a first ring surrounded area corresponding to a first cut-off frequency band of the predetermined frequency band, the second ring resonator has a second ring surrounded area corresponding to a second cut-off frequency band of the predetermined frequency band, and the first ring surrounded area is different in size from the second ring surrounded area;
forming a ground metal layer in a third circuit layer, wherein the third circuit layer is located between the first circuit layer and the second circuit layer, the ground metal layer serves as a common reference ground plane for the first ring resonator and the second ring resonator; and
forming a via structure in the first circuit layer, the second circuit layer and the third circuit layer, wherein the via structure is disposed through the first circuit layer, the second circuit layer and the third circuit layer to be electrically connected to the first ring resonator and the second ring resonator.

13. The method for fabricating the 3D filter of claim 12, further comprising:
forming a first signal feed-in line, a first signal output line, a third open stub, a fourth open stub and a second metal patch in the second circuit layer according to the predetermined frequency band of the 3D filter.

14. The method for fabricating the 3D filter of claim 12, further comprising:
forming a second signal feed-in line, a second signal output line, a first open stub, a second open stub and a first metal patch in the first circuit layer according to the predetermined frequency band of the 3D filter.

15. The method for fabricating the 3D filter of claim 12, further comprising:
forming an opening in the ground metal layer, wherein the via structure passes through the opening to vertically penetrate the ground metal layer.

* * * * *